United States Patent [19]

Haond et al.

[11] Patent Number: 4,678,538

[45] Date of Patent: Jul. 7, 1987

[54] PROCESS FOR THE PRODUCTION OF AN INSULATING SUPPORT ON AN ORIENTED MONOCRYSTALLINE SILICON FILM WITH LOCALIZED DEFECTS

[75] Inventors: Michel Haond, Meylan; Daniel Bensahel, Grenoble; Didier Dutartre, Meylan, all of France

[73] Assignee: Etat Francais Represente Par Le Minitre Des Ptt, Centre National D'Etudes Des Telecommunications, Issy Les Moulineaux, France

[21] Appl. No.: 853,906

[22] Filed: Apr. 21, 1986

[30] Foreign Application Priority Data

Apr. 19, 1985 [FR] France ............................... 85 06000

[51] Int. Cl.[4] .................... H01L 21/306; B44C 1/22; C03C 15/00; C03C 25/06
[52] U.S. Cl. .................................. 156/643; 156/603; 156/617 R; 156/620; 156/644; 156/646; 156/647; 156/653; 156/657; 156/659.1; 156/662; 427/86
[58] Field of Search ............... 156/643, 644, 646, 647, 156/648, 649, 653, 657, 659.1, 661.1, 662, 600, 603, 612, 617 R, 620; 427/86

[56] References Cited

U.S. PATENT DOCUMENTS 4,350,561 9/1982 Little .............................. 156/647 X
4,536,251 8/1985 Chiang et al. ..................... 156/657

OTHER PUBLICATIONS

Applied Physics Letters, vol. 41, No. 1, Jul. 1982, pp. 64-67, American Institute of Physics, New York, U.S.; J. Sakurai et al.: "Laser-Induced Lateral Expitaxial Growth of Silicon Over Dioxide with Locally Varied Encapsulation"-p. 65, FIGS. 1,2.
Journal of Applied Physics, vol. 55, No. 6, Mar. 15, 1984, pp. 1607-1609, American Institute of Physics, New York, U.S.; S. Kawamura et al.: "Laser Recrystallization of Si Over $SiO_2$ with a Heat-Sink Structure"-p. 1607, FIG. 2.

Primary Examiner—William A. Powell
Attorney, Agent, or Firm—Oblon, Fisher, Spivak, McClelland & Maier

[57] ABSTRACT

Process for the production of an oriented monocrystalline silicon film with localized defects on an insulating support.

This process consists of covering a monocrystalline silicon support of orientation (100) with a $SiO_2$ layer, producing in the latter a configuration having in the form of oriented (100) parallel insulating strips, an alternation of overhanging parts and recessed parts carrying out the etching of the $SiO_2$ layer in order to locally form at the ends of said layer at least one opening, said etching being continued until the substrate is exposed, depositing on the etched $SiO_2$ layer a silicon film, covering the silicon film with an encapsulating layer, carrying out a heat treatment of the structure obtained in order to recrystallize the silicon film in monocrystalline form with the same orientation as the substrate and eliminating the encapsulating layer.

12 Claims, 8 Drawing Figures

PROCESS FOR THE PRODUCTION OF AN INSULATING SUPPORT ON AN ORIENTED MONOCRYSTALLINE SILICON FILM WITH LOCALIZED DEFECTS

BACKGROUND OF THE INVENTION

The present invention relates to a process for the production, on an insulating support, of a monocrystalline silicon film with localized defects, having e.g. a crystallographic orientation (100).

It more particularly applies to the field of producing MOS or bipolar integrated circuits, particularly with a high operating speed, which resist ionizing radiations and/or operating under high voltage and being able to dissipate high power levels. It also applies to the production of the control circuits of matrix flat screens or transparent amorphous substrates, such as glass.

Silicon-on-insulant technology constitutes a significant improvement compared with standard technologies in which the active components of the integrated circuits are directly produced on a monocrystalline solid silicon substrate. Thus, the use of an insulating material leads to a significant decrease in the parasitic capacitances between the source and substrate on the one hand and the drain and substrate on the other of the active components of the integrated circuits and consequently to an increase in the operating speed of said circuits.

Moreover, this technology makes it possible to significantly decrease the parasitic charges introduced into the integrated circuits operating under ionizing radiation, in view of the fact that such radiations cannot ionize the insulating support on encountering a solid silicon support. Moreover, this technology makes it possible to increase the integration density of the integrated circuits, because they make it possible to avoid latch-up due to the breakdown of the junctions of said integrated circuits. Finally, this technology leads to a significant simplification of the processes for producing integrated circuits, as well as to a better resistance of said circuits to high voltages.

The obtaining of monocrystalline semiconductor films and in particular silicon films on insulating supports has been studied with a view to producing flat screens and there control circuits on transparent amorphous substrates. When the first experiments using laser beams or electron beams revealed that it was possible to grow silicon grains by heating them and particularly by melting the deposited silicon, as a result of a zone micromelting, increased activity took place with a view to obtaining monocrystalline silicon films on an insulating support.

This lead to a search for methods making it possible to rapidly treat industrial silicon wafers, as well as the search for heating devices with a lower cost than a laser source on an electron gun. Thus, use was made of graphite resistors or filament or arc lamps. These heating devices have more particularly been described in an article by M. W. GEIS et al, which was published in Applied Physics Letters, 37, May 1980, p454 and in French patent application No. 2 532 783 of 7.9.1982.

Unfortunately, none of these known heating methods has made it possible to produce monocrystalline silicon films without defects over the entire surface of a silicon wafer with industrial dimensions (diameter 100 mm).

All the experiments would seem to show that, even with non-coherent energy beams permitting the recrystallization of entire silicon wafers in a single passage, it is difficult to envisage eliminating the residual defects, such as grain boundaries and subboundaries or other dislocations. This is even more true in view of the fact that silicon films are thin, i. e. having a thickness below 0.5 μm.

Moreover, in order to orient the recrystallized semiconductor film, attempts where made to use a fine grating etched in the insulating support in the manner described by M. M. GEIS et al, in Appl Phys Lett, H 35, July 1979, pp 71–74 "crystallographic orientation of silicon on an amorphous substrate using an aritifical surface - relief grating and laser crystallization". Unfortunately the methods used in silicon zone melting, like those described in the article by M.W. GEIS and in FR-A-2 532 783 did not make it possible to obtain completely oriented, defect-free, recrystallized silicon wafers.

On of the most frequently used methods for obtaining a monocrystalline silicon film on an insulating support consists of forming on a monocrystalline silicon substrate of given orientation, a silicon oxide film, particularly by thermal oxidation and then depositing on the said film a polycrystalline silicon film and finally the film undergoes heat treatment, such as a scanning of a melted zone of the film in order to recrystallize the silicon. In such a procedure, consideration was given to making openings in the silicon oxide film so as to use the monocrystalline substrate as a recrystallization germ or nucleus in order to orient the recrystallized film and prevent its disorientation, which are the main reasons why grain boundaries and subboundaries appear. This nucleation process is particularly described in the article by M. FEN published in Appl Phys Lett, 38, 1981, p 365.

In this procedure, it appeared necessary to reproduce with a short period (less than 500 μm) the so-called nucleation openings in the silicon oxide film so as not to loose the initial orientation. However, this leads to the disadvantage of requiring, following the recrystallization of the silicon film, a localized oxidation stage of said nucleation zones in order to insulate the recrystallized semiconductor film from the monocrystalline substrate and to the be able to use the different, aforementioned advantages as compared with the silicon on-insulant technology. Moreover, there oxidized zones lead to a space loss, because it is not possible to produce integrated circuits insulated from one another to these oxidized zones.

Moreover, an investigation has taken place of the formation an appearance of grain boundaries and subboundaries with a view to discovering localization procedures for these defects in narrow zones where the active zones (the transistor gates) of the integrated circuits are not produced. In particular, by recrystallizing the semiconductor film on the insulating support by scanning a melted silicon zone, it was found that the boundaries and subboundaries of the grains formed in the zones which solidified last after the passage of the melted zone.

By using in this recrystallization method a laser source, where the energy can be concentrated on a very narrow spectrum, it is possible to couple to a greater or lesser extent the energy of the laser beam with the semiconductor film and to heat to a greater or lesser extent a particular zone of said film as compared with another zone. This can be realized, in the manner described in French patent application No. 83 16396 by using antireflecting parallel strips on the silicon film to be crystallized and which act as crystallization delaying means, and by calculating the thickness of the antireflecting strips and the reflecting strips (silicon strips), in order to adjust the energy of the laser beam interacting with the silicon film. However, in the case of an incoherent light source, in view of the broad emission spectrum thereof, it is difficult to adjust the thicknesses of the reflecting and antireflecting strips in order to attempt to bring into phase the light waves striking the structure. However, as described in the article M.W. GEIS et al, published in j Electrochem Soc : Solid-state Science and Technology, 130, pp 1178–1183 of May 1983 and entitled "Solidification-Front Modulation to Entrain Subboundaries in Zone Melting Recrystallization of Si on $SiO_2$", use was made of black bodies or metal layers for their relecting properties in a broad spectrum.

In the same way, in an article by D. BENSAHEL, et al published in Electronics Letters of 23.6.1983, vol 19, No 13, pp 464–466 and entitled "Localization of defects on SOI films via selective recrystallization using halogen lamps", use was made of deposited layers of different index as rough refractive index adapting means without using limited calibrated thicknesses.

In another process for the localization of residual defects in a crystallized silicon film, the isotherms of the semiconductor melted zone where modified using a selective diffusion of the heat in the underlying substrate and varying the thickness of the silicon oxide film supporting the semiconductor film. This process using a laser source as a heating source was described in an article by S. KAWAMURA et al, published in J Appl Phys, 55 (6) of 15.3.1984, pp 1607 to 1609 entitled "Laser recrystallization of Si over $SiO_2$ with a heat sink structure".

When it is possible to localize the different recrystallization defects of the silicon film, as described hereinbefore, the main remaining problem is that of the crystalline orientation of the recrystallized film. If with non-coherent energy beams the recrystallized film has a texture (100) perpendicular to the plane of the film, in the case of laser beams this film is not generally oriented and it is necessary to use germination openings towards the monocrystalline substrate made in the silicon oxide film. However, in the case of non-coherent energy beams, the silicon film remains disoriented in the plane of the film. The diorientation is approximately 30° compared with the displacement direction of the melted zone.

In the case of non-coherent energy beams, other problems remain and in particular the behavior of the semiconductor films during zone melting. Thus, when the silicon is liquid and in contact with the silicon oxide, which is generally used as the insulating support, the silicon does not wet the insulant and has the tendency to form drops. In addition, it is necessary to find an effective "encapsulant", i.e. an element enclosing the semiconductor film making it possible to maintain the latter in contact with the insulating support and consequently prevent silicon drop formation, so as to limit the melted silicon mass transfer.

Recent studies using a non-coherent energy beam for recrystallizing the silicon film have shown that an etched pattern relief in the silicon oxide film supporting the silicon film could improve the behavior of the liquid silicon, at least in the hollowed out parts of the relief. These studies where covered by a publication by W. SCHARFF et al in Thin Solid Film, 113, 1984, pp 327–335 entitled "Growth of monocrystalline silicon islands on insulations substrates".

Moreover, attempts are generally made to prevent silicon drop formation by covering the silicon film with a thick layer of silicon oxide or silicon nitride, (2 μm for a 0.5 μm silicon film). However, even with such material thicknesses it sometimes occurs that the silicon forms into drops, so that completely unusable silicon wafers are obtained.

SUMMARY OF THE INVENTION

The present invention relates to a process for the production of a monocrystalline silicon film on an insulating support making it possible to obviate the disadvantages referred to hereinbefore. This process, which more particularly uses the zone melting method for forming the monocrystalline semiconductor film, makes it possible to precisely localize the crystallization defects and the formation of (100) oriented silicon monocrystals, i.e. pependicular to the plane of the silicon film and parallel to the displacement direction of the melted line.

More specifically, the present invention relates to a process for the production of a monocrystalline silicon film on an insulating support comprising the following successive stages:

(a) covering a monocrystalline silicon substrate of given orientation with an insulating material layer, (b) forming in the insulating layer, by a first etching thereof, overhanging strips and recessed strips, which are parallel and alternate, with an orientation close to an orientation (100) of the substrate, the widths of the overhanging strips being smaller than that of the recessed strips, (c) producing a second etching of the insulating layer in order to locally form at the ends of said layer at least one opening, said second etching being continued until the substrate is exposed, (d) depositing on the etched insulating layer a silicon film, (e) covering the silicon film with a layer of an encapsulating material, (f) carrying out a heat treatment of the structure obtained in order to recrystallize the silicon film in monocrystalline form with the same orientation as the insulating strips and, (g) eliminating the encapsulating material layer.

The production be etching of the insulating support of overhanging strips and recessed strips which are parallel to one another permits a good localization of the residual crystallization defects of the silicon film.

Thus, the overhanging strips or parts ensure the localization of the grain boundaries and subboundaries as a result of a modulation of the isotherm of the recrystallization front. The solidification is delayed in the thickest insulating zones (overhanging parts), due to the heat conductivity difference between the thick insulant and the thin insulant. Thus, the crystallization defects are localized just above insulating steps.

Moreover, the configuration of the overhanging and recessed strips makes it possible to avoid melted silicon drop formation on the insulant, when the latter is of silicon oxide, which makes it possible to use thinner encapsulating material layers than in the prior art. If, by chance silicon drops are formed, the liquid would still remain confined between the two overhanging parts or steps, it being difficult to pass beyond these.

The formation of the openings at the ends of the insulating layer preferably located in the recessed insulating strips, makes it possible to use the monocrystalline substrate as a recrystallization germ for the silicon film, which makes it possible to orient the film and prevent disorientations, which are the main reasons why grain boundaries and subboundaries appear.

Advantageously, the substrate has a crystalline orientation (100). It would appear that the more the crystalline orientation moves away from (100), the more the recrystallized silicon film has defects.

According to a preferred embodiment of the inventive process, stage (f) consists of locally melting the silicon film and moving the melted zone parallel to the insulating strips, the melted zone having the shape of a line perpendicular to said strips.

Advantageously, the melted silicon zone, in the form of a line perpendicular to the overhanging and recessed insulating strips, is obtained by subjecting the complete structure to the action of an energy line, perpendicular to said insulating strips, which move parallel thereto.

In order to guide the crystalline orientation of the recrystallized silicon film, the melted zone is moved at a slow speed, i.e. below 0.5 mm/s. Preferably, the displacement speed of the melted zone varies from 0.1 to 0.2 mm/s.

Advantageously use is made of a periodic configuration in which the overhanging parts and recessed parts are regularly spaced from one another. This makes it possible to obtain, during the heat treatment. a homogeneous distribution of the energy absorbed and diffused into the silicon film and along the melted zone, which is perpendicular to the insulating strips.

The use of a periodic configuration is particularly interesting for subsequent technical treatment reasons (production of integrated circuits). Thus, the designers of integrated circuits wish to have maximum monocrystalline regions without defects. Accordingly on determining a critical width of the insulating parts, it was preferable to repeat it in order to prevent a space loss in the case of reducing said width, or an appearance of defects in the case of increasing said width. Moreover, a periodic configuration can be of interest during the production of periodically reproduced components or circuits (matrix, memory, pre-diffused networks or gratings, etc).

If need be, it is possible to flatten the surface of the silicon film deposited prior to recrystallizing it. This can advantageously be obtained by "planarization", which consists of covering the silicon film with a layer of insulating material and particularly a resin of the type generally used in photolithography, followed by the simultaneous etching of said insulating material layer and the silicon film at identical etching speeds for insulant silicon, so that the insulant and the relief parts of the silicon film are completely eliminated.

Advantageously, the etching of the insulating layer to form the periodic configuration and/or the openings is carried out by a reactive ionic etching process, which makes it possible to obtain rigid etched edges. The latter improve the wetting of the liquid silicon on the insulating support or block the droplet formation of the melted silicon.

BRIEF DESCRIPTION OF THE DRAWINGS

The invention is described in greater detail hereinafter relative to non-limitative embodiments and the attached drawings, wherein show:

FIGS. 4 and 6 insulating the same stages of the process, FIG. 4 corresponding to a section at the nucleation openings and FIG. 6 to a section in the centre of the structure.

DETAILED DESCRIPTION OF THE PREFERRED EMBODIMENTS

Figure 1:
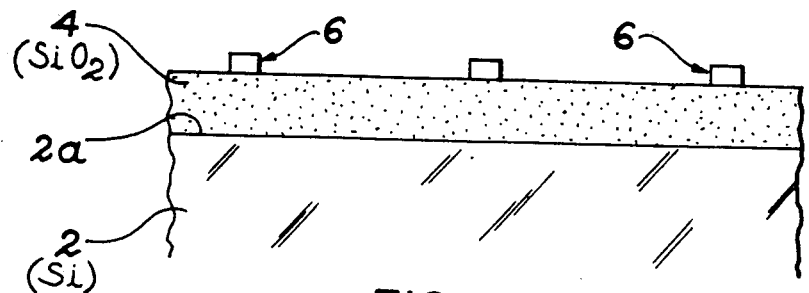
FIGS. 1, 2, 4, 6 to 8 longitudinal sectional views showing the different stages of the production process for a monocrystalline silicon film according to the present invention.

A shown in FIG. 1, the first stage of the process consists of completely covering the surface 2a of a monocrystalline silicon substrate 2 with an insulating material layer 4. The silicon substrate 2 e.g. has a crystalline orientation (100), i.e. an orientation perpendicular to the substrate surface 2a. The insulating material layer 4 can either be of silicon oxide, or of silicon nitride.

In the case of a silicon oxide layer 4, the latter can be obtained by thermal oxidation of substrate 2, under dry or wet oxygen at a temperature of 800° to 1100° C., e.g. 1000° C. Oxide layer 4 e.g. has a thickness of 0.5 to 1.5 $\mu$m.

On insulating layer 4 is then formed an etching mask 6 making it possible to define the location and the dimensions of the overhanging parts or steps to be produced in the insulating layer 4. Mask 6 is e.g. a resin mask, produced according to conventional photolithography processes.

Figure 2:
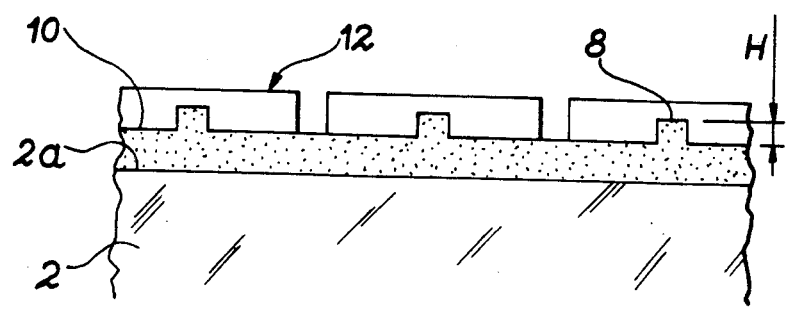

Through mask 6, as shown in FIG. 2, is carried out a first etching of insulating layer 4, in order to eliminate over a height H the regions of the insulant not covered with resin. In the case of a 1 $\mu$m thick silicon oxide layer 4, said height H can be between 200 and 500 nm and is e.g. 400 nm.

Figure 3:
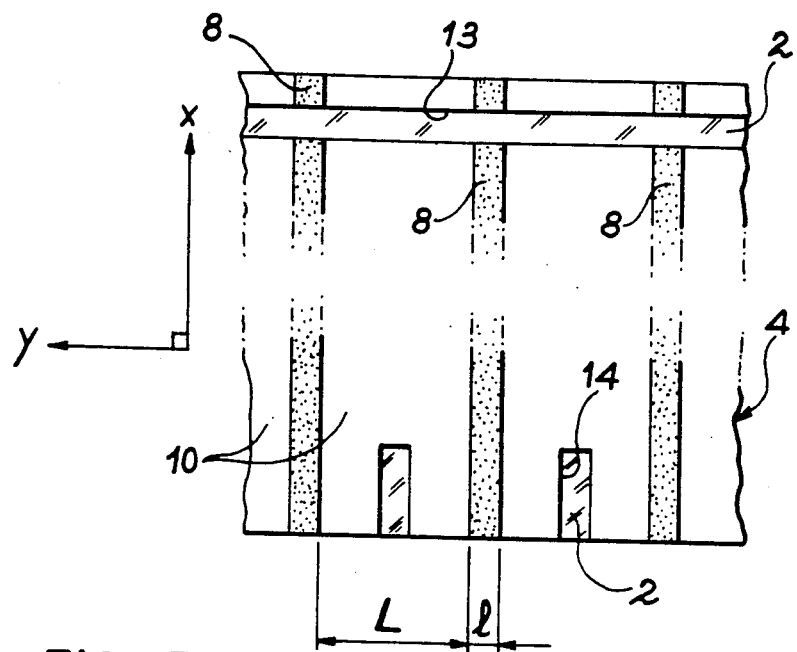
FIGS. 3 and 5, plan views showing various shapes of nucleation openings.

In order to obtain straight etched edges, the etching of the insulating layer can be carried out anisotropically by reactive ionic etching, using as the etching agent a carbon tetrafluoride plasma or a trifluoromethane plasma in the case of a silicon oxide layer 4. This etching of insulating layer 4 makes it possible to form a preferably periodic configuration having overhanging parts or steps 8 of a similar nature ans also similar recessed or hollowed out parts 10. These overhanging and recessed parts 8, 10 respectively, as shown in FIG. 3, are in the form of parallel insulating strips, which are preferably regularly spaced from one another. Insulating strips 8 and 10 advantageously extend from edge to the other of the structure in a direction X and are located in the plane of the insulating layer. Their direction in the plane is close to one of the directions (100) of the substrate.

The width L of the recessed parts 10, above which could be formed the active zones of the integrated circuits, is greater than the width 1 of the overhanging parts or steps 8. For example, the overhanging parts 8, above which will be localized the crystallization defects (grain boundaries and subboundaries) of the monocrystalline silicon film to be produced, have a width 1 which can vary from 3 to 6 $\mu$m and is e.g. 4 $\mu$m. The recessed zones can have a width L from 20 to 100 $\mu$m for a 100 mm side dimension substrate, e.g. 36 $\mu$m.

Following etching of insulating layer 4, the resin mask 6 is e.g. chemically removed by using as the etching agent acetone or nitric acid, or by the action of an oxygen plasma, for a mask obtained with a positive photosensitive resin.

On the structure obtained, shown in FIG. 2, is produced a second etching mask 12, e.g. of resin, using conventional photolithography processes, making it possible to define the location and dimensions of one or more openings to be produced locally in the insulating layer 4 and preferably in the recessed strips or parts 10 of said insulating layer 4.

Figure 4:
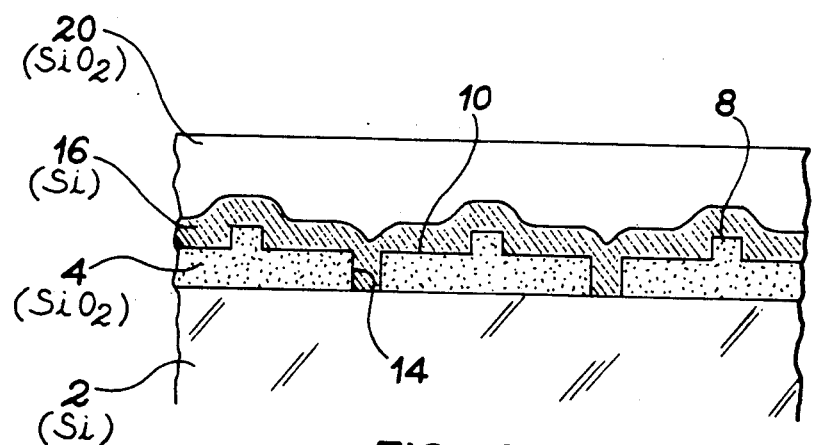
Figure 5:
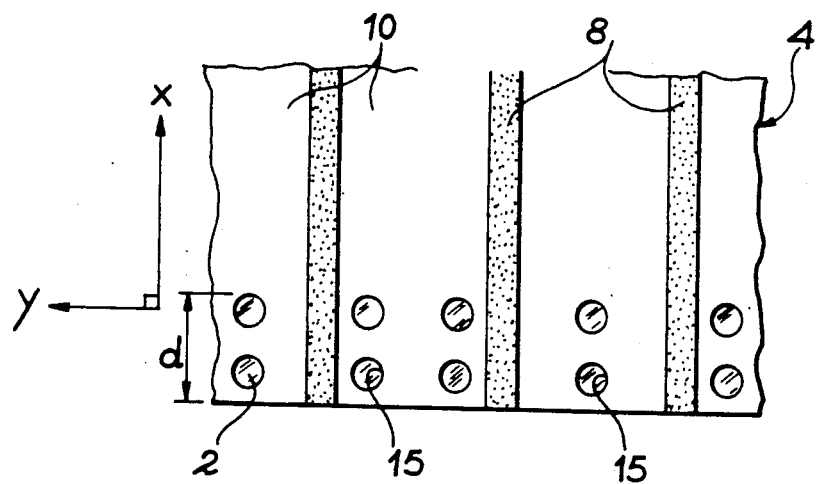

As shown in FIGS. 3 to 5, this is followed by a second etching of the insulating layer 4, in order to completely eliminate those parts of layer 4 not covered with resin and consequently form one or more openings issuing onto substrate 2. During the recrystallization of the silicon film, said openings would make it possible to use the monocrystalline substrate 2 as a nucleus for giving a crystalline orientation of the silicon film, in all the s insulating recessed parts 10 close to that of the substrate. As hereinbefore, said etching is preferably carried out anisotropically, in order to form rigid edges. For example, said etching is reactive ionic etching using as the etching agent a carbon tetrafluoride or trifluoromethane plasma for a silicon oxide film or layer 4.

The germination opening or openings can have different shapes. In particular and as shown in FIG. 3, it is possible to use a single opening in the form of a strip 13 oriented in a direction Y perpendicular to direction X and consequently to the insulating strips 8 and 10. Strip 13 advantageously extends from one edge to the other of insulating layer 4. It can have a width between 1 and 10 μm.

It is also possible to use several germination openings 14, e.g. having a parallelepipedic shape. These openings 14 can advantageously be located in the centre of the recessed parts 10 of insulating layer 4, one opening per recessed part, for reasons of growth symmetry of the silicon. These openings 14 can have a length of several millimeters for a width of 2 to 20 μm.

It is also possible to use several holes 15, as shown in FIG. 5, having a diameter between 2 and 10 μm, e.g. 5 μm and separated from one another by 10 to 100 μm and e.g 30 μm. These holes 15 can in particular be located in the recessed parts 10 of insulating layer 4 and can be arranged in the form of rows, parallel to direction Y and consequently perpendicular to said parts 10. The distance d over which the holes are made is e.g. 1.5 μm.

No matter what the shape and number of the nucleation openings produced, the latter must be located at the ends of the insulating layer 4 and in particular at the ends from where the insulating overhanging strips 8 and recessed strips 10 start.

After forming the nucleation opening or openings, the resin mask 8 (FIG. 2) is eliminated, e.g. chemically using as the etching agent acetone or nitric acid, or by the action of an oxygen plasma for a mask obtained with a positive photosensitive resin.

Figure 6:
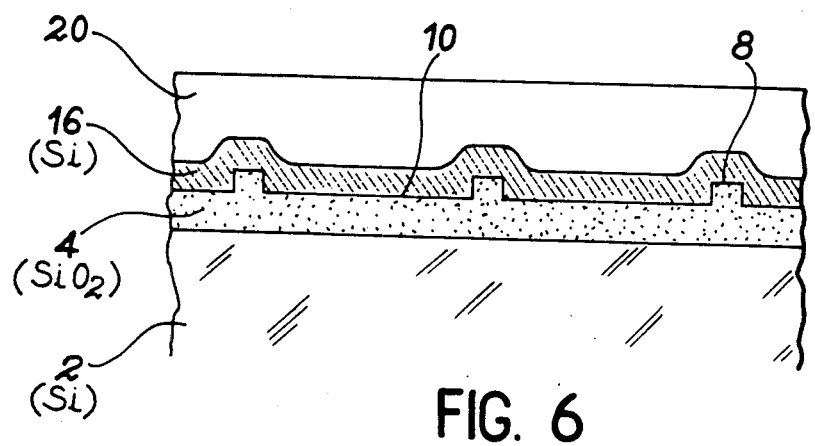

The following stage of the process, as shown in FIGS. 3 and 6, consists of covering the complete structure with a silicon film 16. This silicon can be either amorphous silicon, or polycrystalline silicon. This silicon film 16 has a thickness from 0.1 to 1 μm and is e.g. 0.5 μm. When the deposited silicon is polycrystalline silicon, the silicon film can be obtained by a low pressure chemical vapour deposition process (LPCVD) at a temperature of approximately 625° C. by pyrolysis of $SiH_4$.

In the case where the silicon film 16 does not have a planar surface (FIGS. 4 and 6), which is the case when the overhanging parts or steps 8 are relatively high compared with the thickness of the silicon film, it is preferable to flatten or level said surface by a so-called planarization process.

Figure 7:
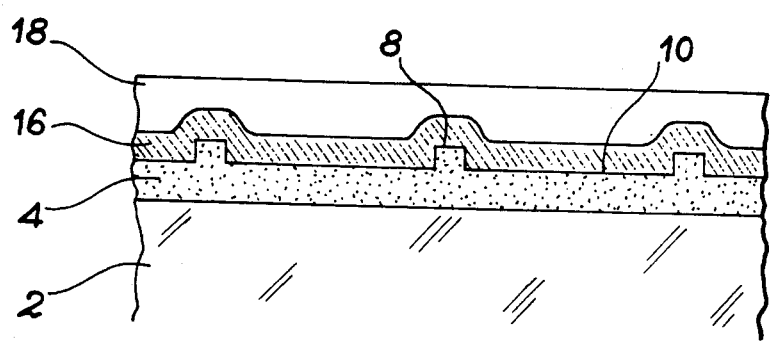

This flattening of the surface of silicon film 16 (FIG. 8) is e.g. obtained by covering, as shown in FIG. 7, said film 16 with an insulating material layer 18 canceling out the relief of silicon films 16. Insulating layer 18 is preferably made from resin, like that currently used in photolithography. The deposition of resin layer 18, which has a thickness of a few μm, can be followed by a heat treatment, e.g. heating to a temperature of approximately 100° C. for 30 mn, so as to obtain a good spread of resin layer 18.

Figure 8:
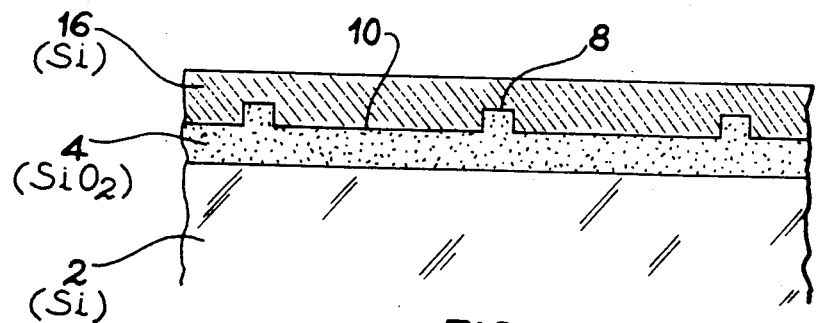

This is followed by the simultaneous etching of the resin layer 18 and the silicon film 16, at identical etching speeds for resin and silicon up to the total elimination, as shown in FIG. 8, of resin layer 18 and consequently the relief areas of silicon film 16. Said etching is preferably carried out anisotropically, e.g. by a reactive ionic etching process using as the etching agent a sulphur hexafluoride and oxygen plasma, the fluorinated compound serving to etch the silicon and the oxygen to etch the resin.

The following stage of the process, as shown in FIGS. 4 and 6, consists of covering the optionally flattened silicon film 16 and an encapsulating layer 20, e.g. made from silicon oxide or silicon nitride or even in the form of a two-layer material. This encapsulating material layer more particularly has a thickness from 1 to 2 μm and is e.g. 1.6 μm. It can in particular be obtained by a low pressure, low temperature vapour phase chemical deposition process, e.g. at 430° C. by pyrolysis of $SiH_4 + O_2$, when said layer of silicon oxide, or by cathodic sputtering when the layer is of silicon nitride. The following stage of the process consists of subjecting the structure obtained, shown in FIGS. 4 and 6, to a heat treatment making it possible to recrystallize the silicon film 16 in monocrystalline form.

The recrystallization nuclei of the silicon can be obtained by lateral epitaxy of the substrate 2 during said heat treatment. Thus, these nucleation zones from the substrate 2 can be obtained in all known ways, because only the orientation, e.g. (100) is important and not the quality thereof.

The heat treatment firstly consists of a preheating stage consisting of placing the complete structure in an oven and raising it to a temperature below the melting temperature of the silicon, which is approximately 1410° C. For example, the structure can be raised to a temperature of 800° to 1200° C. and particularly 1100° C.

Following the preheating stage, local melting of the silicon film 16 takes place in the nucleation opening zone and the thus obtained melted zone is moved in a direction X (FIGS. 3 and 5) parallel to the insulating strips 8 at a relatively slow speed and particularly below the 0.5 mm/s. Preferably, the scanning speed of the melted zone varies from 0.1 to 0.2 mm/s.

The melted silicon zone is in the form of a line, e.g. 2 to 5 mm wide and whose length is least equal to that of an industrial silicon wafer (diameter 100 mm). This melted zone line can e.g. be formed by sujecting the surface of the structure of an energy beam of width 2 to 5 mm oriented in direction Y and perpendicular to insulating strips 8. This energy line passes parallel to the said strips in direction X.

This energy line can advantageously be produced with the aid of a heated graphite bar or a linear lamp focused onto the surface of the structure. A heating device usable in the invention is particularly that described in French patent application No. 2 532 783.

The following stage of the process consists of eliminating the encapsulating material layer 20 by chemical etching in a hydrofluoric acid bath, when said layer is made from silicon oxide. The final structure is that shown in FIG. 8.

The aforementioned process makes it possible to obtain wide strips (recessed parts 10) of silicon, each formed by a defect-free monocrystal, e.g. 36 μm wide and 100 mm long, having an orientation (100), on which can be produced the active zones of the integrated and in particular MOS or polar circuits. Residual defects, such as boundaries and subboundaries of grains or other dislocations, which cannot be eliminated during the recrystallization of the silicon film, are exclusively located between these monocrystalline strips, i.e. level with steps 8 and are typically 4 μm wide and 100 mm long. The monocrystalline silicon strips can be considered independently of one another.

The different stages of the process according to the invention have the advantage of being simple, easily reproducible and of being well controlled by the expert. If need be, the silicon zones used as nuclei for the monocrystalline growth of silicon film 16, i.e. the zones of the film surmounting the openings made in insulating layer 4 can be insulated from the remainder of the structure, e.g. by carrying out a local thermal oxidation of said zones.

The above description has only been given in an illustrative manner, whilst modifications are possible thereto without passing beyond the scope of the invention.

In particular, the thickness of the different layers and films, the nature thereof and there deposition processes, as well as the etching processes can be modified. In the same way, the dimensions of the insulating strips 8, 10 and the nucleation openings can be modified. Moreover, there arrangement does not necessarily form a periodic structure. Moreover, certain stages of the process can sometimes be eliminated. In the case of a thick silicon film (approximately 1 μm), the different known silicon deposition methods make it possible to obtain a film with an adequately flat or planar surface, without using the so-called planarization stage. Moreover, for a height H of step 8 of only e.g. 0.2 μm, the planarization stage is not necessary, even for a 0.5 μm thick silicon film.

Moreover, the heat treatment making it possible to crystallize the silicon film can be carried out with a process different from that described. In particular, the energy line can be realized with the aid of a laser beam or electrons focused onto the surface of the structure rapidly scanning said surface in direction Y, perpendicular to the insulating strips.

What is claimed is:

1. a process for the production of a monocrystalline silicon film on an insulating support comprising the following successive stages:

(a) covering a monocrystaline silicon substrate of given orientation with an insulating material layer,
(b) forming in the insulating layer, by a first etching thereof, overhanging strips and recessed strips, which are parallel and alternate, with an orientation close to an orientation (100) of the substrate, the widths of the overhanging strips being smaller than that of the recessed strips,
(c) producing a second etching of the insulating layer in order to locally form at the ends of said layer at least one opening, said second etching being continued until the substrate is exposed,
(d) depositing on the etched insulating layer a silicon film,
(e) covering the silicon film with a layer of an encapsulating material,
(f) carrying out a heat treatment of the structure obtained in order to recrystallize the silicon film in monocrystalline form with the same orientation as the insulating strips and,
(g) eliminating the encapsulating material layer.

2. A production process according to claim 1, wherein the substrate has a crystalline orientation (100).

3. A production process according to claim 1, wherein stage (f) consists of locally melting the silicon film and moving the melted zones parallel to the insulating strips, the melted zone being in the form of a line perpendicular to said strips.

4. A Production process according to claim 3, wherein the melted zone is moved at a speed below 0.5 mm/s.

5. A production process according to claim 3, wherein the melted zone is moved at a speed of 0.1 to 0.2 mm/s.

6. A production process according to claim 1, wherein the heat treatment is performed by subjecting the structure to the action of an energy line perpendicular to the insulating strips and moving parallel to the latter.

7. A production process according to claim 1, wherein the openings are located in the recessed strips.

8. A production process according to claim 1, wherein the overhanging strips and the recessed strips are arranged according to a periodic configuration.

9. A production process according to claim 1, wherein the first and/or second etchings of the insulating strip are reactive ionic etchings.

10. A production process according to claim 1, wherein the insulating layer and/or the encapsulating material layer are made from silicon oxide.

11. A production process according to claim 1, wherein stage d) conists of depositing an amorphous or polycrystalline silicon film.

12. A production process according to claim 1, wherein, before stage (f), a layer of another insulating material is deposited on the silicon film canceling out the relief of the silicon film, followed by the simultaneous etching of said insulating material layer and the silicon film at identical etching speeds for the insulant and the silicon, until the insulating material layer and the relief parts of the silicon film are completely eliminated, in order to flatten the surface of said film.

* * * * *